(12) United States Patent
Fang

(10) Patent No.: US 11,527,734 B2
(45) Date of Patent: Dec. 13, 2022

(54) AUXILIARY ELECTRODE TRANSFER STRUCTURE AND MANUFACTURING METHOD FOR DISPLAY PANEL

(71) Applicant: Shenzhen China Star Optoelectronics Semiconductor Display Technology Co., Ltd., Shenzhen (CN)

(72) Inventor: Chunhsiung Fang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 125 days.

(21) Appl. No.: 16/603,298

(22) PCT Filed: Jun. 18, 2019

(86) PCT No.: PCT/CN2019/091630
§ 371 (c)(1),
(2) Date: Oct. 7, 2019

(87) PCT Pub. No.: WO2020/220442
PCT Pub. Date: Nov. 5, 2020

(65) Prior Publication Data
US 2021/0336186 A1    Oct. 28, 2021

(30) Foreign Application Priority Data
Apr. 29, 2019    (CN) .......................... 201910352512.7

(51) Int. Cl.
*H01L 51/00*    (2006.01)
*H01L 51/52*    (2006.01)

(52) U.S. Cl.
CPC ...... *H01L 51/5228* (2013.01); *H01L 51/0023* (2013.01)

(58) Field of Classification Search
CPC . H01L 51/5228; H01L 51/0023; H01L 21/77; H01L 51/0021
USPC .......................................................... 438/34
See application file for complete search history.

(56) References Cited

U.S. PATENT DOCUMENTS

| | | | |
|---|---|---|---|
| 6,114,088 A | 9/2000 | Wolk et al. | |
| 6,194,119 B1 | 2/2001 | Wolk et al. | |
| 6,586,153 B2 * | 7/2003 | Wolk | B41M 5/265 |
| | | | 430/200 |
| 6,855,384 B1 * | 2/2005 | Nirmal | B41M 5/38207 |
| | | | 428/32.6 |

(Continued)

FOREIGN PATENT DOCUMENTS

| CN | 1337905 | 2/2002 |
|---|---|---|
| CN | 1469814 | 1/2004 |

(Continued)

*Primary Examiner* — Sheikh Maruf
(74) *Attorney, Agent, or Firm* — PV IP PC; Wei Te Chung; Ude Lu

(57) ABSTRACT

The present invention discloses an auxiliary electrode transfer structure and a manufacturing method for a display panel. The auxiliary electrode transfer structure includes a transparent base layer; a light-to-heat transformation layer disposed above the transparent base layer; and an auxiliary electrode disposed above the light-to-heat transformation layer; a laser mechanism configured to form laser, wherein the laser penetrates the transparent base layer to the light-to-heat transformation layer.

5 Claims, 2 Drawing Sheets

(56) References Cited

U.S. PATENT DOCUMENTS

| | | | |
|---|---|---|---|
| 7,223,515 B1* | 5/2007 | Wolk | B41M 5/465 428/913 |
| 9,324,962 B2 | 4/2016 | Kim | |
| 2003/0049560 A1* | 3/2003 | Nirmal | B41M 5/395 430/319 |
| 2004/0005739 A1* | 1/2004 | Furusawa | H01L 31/02164 438/149 |
| 2006/0138945 A1* | 6/2006 | Wolk | H01L 27/322 313/506 |
| 2006/0181658 A1* | 8/2006 | Majumdar | G02F 1/13476 349/86 |
| 2008/0014528 A1* | 1/2008 | Bailey | B41M 5/38207 430/200 |
| 2008/0026306 A1* | 1/2008 | Lamansky | B41M 7/0081 430/31 |
| 2008/0107993 A1* | 5/2008 | Wolk | B41M 5/38214 430/200 |
| 2009/0166563 A1* | 7/2009 | Yokoyama | H01L 51/0013 313/504 |
| 2014/0070174 A1* | 3/2014 | Kwon | H01L 33/08 257/40 |
| 2015/0044804 A1* | 2/2015 | Barr | H01L 51/441 438/46 |
| 2015/0279915 A1* | 10/2015 | Morita | H01L 27/3213 257/88 |
| 2016/0260780 A1* | 9/2016 | Kim | G06F 1/1652 |
| 2016/0285023 A1* | 9/2016 | Oooka | H01L 51/4253 |
| 2018/0301522 A1* | 10/2018 | Zhang | H01L 51/5056 |
| 2019/0006443 A1* | 1/2019 | Hanashima | H01L 27/3246 |
| 2019/0081194 A1* | 3/2019 | Oooka | H01L 31/022483 |
| 2019/0363276 A1* | 11/2019 | Li | H01L 51/5072 |
| 2020/0067017 A1* | 2/2020 | Seo | H01L 51/5256 |
| 2020/0303688 A1* | 9/2020 | Kwon | H01L 51/56 |
| 2021/0135153 A1* | 5/2021 | Zhang | H01L 27/3276 |
| 2021/0217961 A1* | 7/2021 | Kong | H01L 51/0016 |

FOREIGN PATENT DOCUMENTS

| | | |
|---|---|---|
| CN | 1841761 | 10/2006 |
| CN | 1917121 | 2/2007 |
| CN | 101916824 | 12/2010 |
| CN | 106926559 | 7/2017 |
| CN | 107093680 | 8/2017 |

* cited by examiner

AUXILIARY ELECTRODE TRANSFER STRUCTURE AND MANUFACTURING METHOD FOR DISPLAY PANEL

RELATED APPLICATIONS

This application is a National Phase of PCT Patent Application No. PCT/CN2019/091630 having International filing date of Jun. 18, 2019, which claims the benefit of priority of Chinese Patent Application No. 201910352512.7 filed on Apr. 29, 2019. The contents of the above applications are all incorporated by reference as if fully set forth herein in their entirety.

FIELD AND BACKGROUND OF THE INVENTION

The present invention relates to the technical field of display, and especially to an auxiliary electrode transfer structure and a manufacturing method for a display panel.

Active-matrix organic light-emitting diode (AMOLED) display devices can be divided into two categories, i.e. bottom emission (emitting light through an array substrate side) and top emission (emitting light through an encapsulation cover glass side). In a top emission AMOLED display device, because an OLED light source has to penetrate an OLED cathode, a transparent or translucent cathode material is required. A conventional transparent cathode material generally adopts a transparent conducting oxide (TCO), for example, an indium doped zinc oxide (IZO), the range of thickness of a TCO is between 100 nm and 500 nm, and the sheet resistance is between 5Ω/□ and 30Ω/□. A translucent cathode generally adopts thin metals (e.g. silver, silver-magnesium alloys, etc.), in order to maintain light transmittance of a translucent cathode being more than 40%, the thickness generally adopted is between 10 nm and 200 nm, and the sheet resistance is between 1Ω/□ and 5Ω/□. A cathode of such resistance is only suitable for small size display devices, if it is applied to large size display devices, IR drop will occur due to high sheet resistance of the cathode, and brightness lessens where farther from a cathode voltage input terminal, which therefore leads to ununiform brightness of a display.

In order to overcome the problem of IR drop due to high sheet resistance of a cathode, in the conventional technology, a photo spacer (PS) is manufactured on a black matrix (BM) of an existing color filter cover plate, the black matrix and the photo spacer having mesh or strips appearance, and then an auxiliary cathode metal is manufactured on the photo spacer. Because where the black matrix and the photo spacer locate is not a light emitting area, a thicker auxiliary cathode can be used to decrease resistance of a cathode, and when a cover glass of a color filter is assembled with an OLED back glass, the auxiliary cathode can contact the translucent OLED cathode to decrease overall resistance of the cathode, which therefore improves the problem of ununiform brightness of an OLED display panel due to IR drop. However, when the size of an OLED display panel becomes large, thickness uniformity of a black matrix and a photo spacer is more difficult to control, and deformation of an OLED back glass will be more serious, which leads to poor connection between an auxiliary cathode and a translucent cathode a problem likely to happen, and a desirable effect is unable to achieve.

There is another approach in the conventional technology to overcome the problem of IR drop due to high sheet resistance of a cathode, that is, after cathodes of OLED devices are formed, printing metallic nanoparticle ink in grooves of these cathodes by inkjet printing, and forming metal lines after curing under high temperatures. Because cathodes of OLED devices and printed metal lines are electrically connected together, the printed metal lines can serve as auxiliary cathodes of the OLED devices, which can effectively decrease resistance of cathodes and improve ununiform brightness of a display panel due to high sheet resistance of cathodes and resultant IR drop. However, OLED devices are very easily damaged by water or solvent, and solvent of printed metallic ink would more or less affect performance and lifetime of OLED devices. Besides, OLED devices cannot endure high temperature processes with more than 100 degrees Celsius temperatures, and therefore curing temperatures of printed metallic ink is limited and resistance cannot be effectively decreased.

SUMMARY OF THE INVENTION

In order to overcome the above-mentioned technical problems, the present invention provides an auxiliary electrode transfer structure and a manufacturing method for a display panel. By using an auxiliary electrode transfer structure to transfer an auxiliary electrode onto electrodes of a display panel, undesirable effects that occurs in a conventional auxiliary electrode transfer can be improved and simultaneously ununiform brightness of a display panel due to high sheet resistance of cathodes and resultant IR drop can be improved.

The technical approach to overcome the above-mentioned problems is that the present invention provides an auxiliary electrode transfer structure that includes a transparent base layer; a light-to-heat transformation layer disposed above the transparent base layer; and an auxiliary electrode disposed above the light-to-heat transformation layer; a laser mechanism configured to form laser, wherein the laser penetrates the transparent base layer to the light-to-heat transformation layer.

According to an embodiment of the present invention, the light-to-heat transformation layer uses materials including thermosetting resin, thermoplastic resin, and a laser-absorbing material, and in the light-to-heat transformation layer, a percentage by weight of the laser-absorbing material is between 20 wt % and 40 wt %.

According to an embodiment of the present invention, the auxiliary electrode transfer structure further includes a barrier layer disposed between the transparent base layer and the light-to-heat transformation layer, wherein the barrier layer uses at least one of silica, silicon nitride, or silicon oxynitride materials.

According to an embodiment of the present invention, the auxiliary electrode transfer structure further includes a graphene layer disposed between the auxiliary electrode and the light-to-heat transformation layer.

According to an embodiment of the present invention, a layer number of the graphene layer is less than or equal to ten layers.

According to an embodiment of the present invention, the auxiliary electrode transfer structure further includes a middle layer using ultraviolet curable resin materials and disposed between the graphene layer and the auxiliary electrode, wherein a thickness of the middle layer is between 1 um and 5 um.

According to an embodiment of the present invention, the auxiliary electrode is made of aluminum and has a thickness between 0.1 um and 1 um.

The present invention further provides a manufacturing method for a display panel including the following steps: providing the auxiliary electrode transfer structure; manufacturing an array substrate and forming a plurality of organic light-emitting diode (OLED) devices on the array substrate, wherein the OLED devices have a first electrode exposed on a surface of the array substrate; flipping the auxiliary electrode transfer structure on the first electrode, wherein the auxiliary electrode is laminated on the first electrode; emitting laser by the laser mechanism, wherein the laser is aimed for a position of the first electrode and penetrates the transparent base layer to the light-to-heat transformation layer, the light-to-heat transformation layer transforms luminous energy of the laser into heat to melt the auxiliary electrode at the position of the first electrode, and a new auxiliary electrode is formed again after a surface of the first electrode cures.

According to an embodiment of the present invention, the step of forming the plurality of OLED devices includes forming a second electrode on the array substrate; forming a hole injection layer on the second electrode; forming a hole transport layer on the hole injection layer; forming an emitting layer on the hole transport layer; forming an electron transport layer on the emitting layer; forming an electron injection layer on the electron transport layer; and forming the first electrode on the electron injection layer.

According to an embodiment of the present invention, the second electrode is an anode and is an opaque electrode, and the first electrode is a cathode and is a transparent or translucent electrode.

According to an embodiment of the present invention, the first electrode of the display panel has a positioning mark on it, and in the step of aiming the laser for a position of the first electrode, the laser is aimed for the position of the first electrode by using the CCD camera to obtain the positioning mark.

An auxiliary electrode transfer structure and a manufacturing method for a display panel according to the present invention can effectively transfer an auxiliary electrode onto cathodes of OLED devices by using an auxiliary electrode transfer structure, effectively improve undesirable effects that occurs in a conventional auxiliary electrode transfer, and simultaneously effectively improves ununiform brightness of a display panel due to high sheet resistance of cathodes and resultant IR drop. In the manufacturing method for a display panel, the method for an auxiliary electrode transfer is easier.

BRIEF DESCRIPTION OF THE SEVERAL VIEWS OF THE DRAWINGS

The accompanying figures to be used in the description of embodiments of the present invention will be described in brief to more clearly illustrate the technical solutions of the embodiments. The accompanying figures described below are only part of the embodiments of the present invention, from which figures those skilled in the art can derive further figures without making any inventive efforts.

DESCRIPTION OF SPECIFIC EMBODIMENTS OF THE INVENTION

Figure 1:
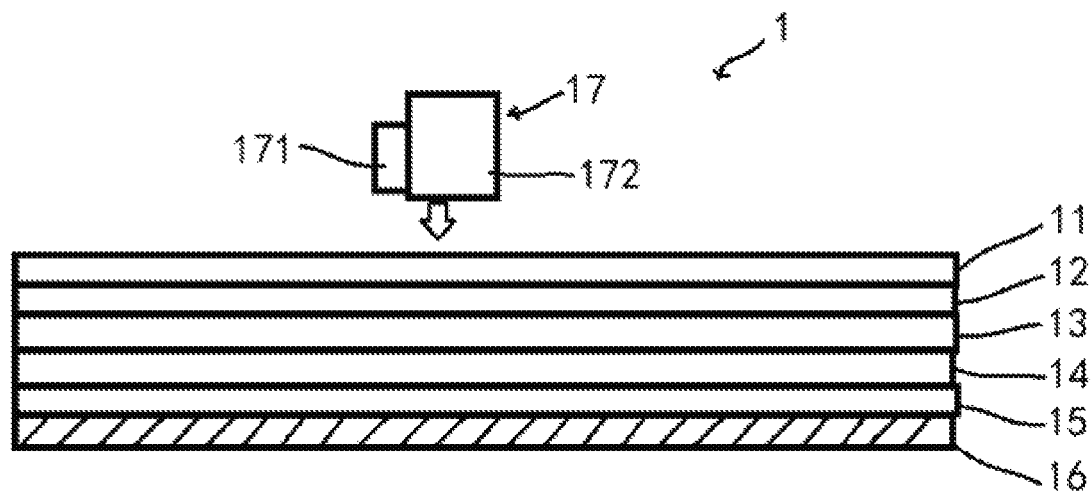
FIG. 1 is a structural schematic diagram of an auxiliary electrode transfer structure according to an embodiment of the present invention, and the down-pointing arrow below the laser mechanism represents laser.

Embodiments of the present invention are described in detail as follows, the embodiments are illustrated in the accompanying drawings, and identical or similar numerals represent identical or similar elements or elements having identical or similar functions. The following embodiments described with reference to accompanying drawings are illustrative, only for explanation of the present invention, and not construed as limiting of the present invention.

The embodiments of the present invention are described in detail hereinafter. Examples of the described embodiments are given in the accompanying drawings. In the description of the present invention, it should be understood that terms such as "upper," "lower," "front," "rear," "left," "right," "top," "bottom," as well as derivative thereof should be construed to refer to the orientation as shown in the drawings under discussion. These relative terms are for convenience of description and shall not be construed as causing limitations to the present invention.

As shown in FIG. 1, in one embodiment, an auxiliary electrode transfer structure 1 of the present invention includes a transparent base layer 11, a barrier layer 12, a light-to-heat transformation layer 13, a graphene layer 14, a middle layer 15, an auxiliary electrode 16, and a laser mechanism 17.

The transparent base layer 11 can be selected as transparent glass or transparent plastic materials.

The barrier layer 12 is disposed on the transparent base layer 11. In the present embodiment, the barrier layer 12 uses at least one of silica, silicon nitride, or silicon oxynitride materials, and can be deposited by using plasma enhanced chemical vapor deposition. In the present embodiment, the barrier layer 12 can improve adhesion tension between subsequent film layers and a transparent substrate. A thickness of the barrier layer 12 is less than or equal to 2 um.

The light-to-heat transformation layer 13 is disposed on the barrier layer 12. In the present embodiment, the light-to-heat transformation layer 13 uses materials including thermosetting resin, thermoplastic resin, and a laser-absorbing material, and in the light-to-heat transformation layer 13, a percentage by weight of the laser-absorbing material is between 20 wt % and 40 wt %. By configuring a percentage by weight of the laser-absorbing material to be between 20 wt % and 40 wt %, higher light-to-heat transformation rates can be ensured and light transmittance can be maintained at the same time. In the present embodiment, the laser-absorbing material can be selected as at least one of carbon black, a dye, and a pigment. When a percentage by weight of the laser-absorbing material is less than 20 wt %, a light-to-heat transformation rate is low, and when a percentage by weight of the laser-absorbing material is greater than 40 wt %, the light transmittance is low. A low light-to-heat transformation rate and low light transmittance both affect a subsequent transfer of the auxiliary electrode 16.

The graphene layer 14 is disposed on the light-to-heat transformation layer 13 and can be deposited by using plasma enhanced chemical vapor deposition. In the present embodiment, a layer number of the graphene layer 14 is less than or equal to ten to maintain light transmittance of the whole auxiliary cathode transfer substrate and facilitate subsequent laser alignment, that is, the laser mechanism 17 can identify a positioning mark on a display panel 2.

The middle layer 15 uses ultraviolet curable resin materials and is disposed on the graphene layer 14, and a thickness of the middle layer 15 is between 1 um and 5 um. The middle layer 15 can block excessive heat conducting at once to a subsequent auxiliary cathode that causes a spatter of the auxiliary cathode.

The auxiliary electrode 16 is disposed on the middle layer 15. The auxiliary electrode 16 is made of aluminum, with thickness between 0.1 um and 1 um. Aluminum has a relatively low melting point, thickness of which cannot be excessively thick that hinders melting under heat conducted from the light-to-heat transformation layer 13, and the thickness also cannot be excessively thin that hinders formation of a new and effective auxiliary electrode 16 on a subsequent electrode, which cannot achieve the purpose of improving higher sheet resistance of a cathode.

The laser mechanism 17 is configured to form laser, and the laser penetrates the transparent base layer 11 to the light-to-heat transformation layer 13. In the present embodiment, at least one laser mechanism 17 is arranged, and the laser mechanism 17 has a charge coupled device (CCD) camera 171 to locate a position of laser. Improvement of the present embodiment is the structure of each of the film layers in the auxiliary electrode transfer structure 1, emphasis of the present embodiment is not placed on improvement of the laser mechanism 17, and hence other parts of the laser mechanism 17 such as a laser generator 172 and the like will not be described in detail.

In order to clearly describe functions of an auxiliary electrode transfer structure 1 according to the present invention, the present invention further provides a manufacturing method for a display panel 2 that includes the following steps.

Step one is providing the auxiliary electrode transfer structure 1.

Step two is manufacturing an array substrate 21 and forming a plurality of organic light-emitting diode (OLED) devices 22 on the array substrate 21, and the OLED devices 22 have a first electrode 227 exposed on a surface of the array substrate 21. The step of forming the OLED devices 22 includes forming a second electrode 221 on the array substrate 21, forming a hole injection layer 222 on the second electrode 221, forming a hole transport layer 223 on the hole injection layer 222, forming an emitting layer 224 on the hole transport layer 223, forming an electron transport layer 225 on the emitting layer 224, forming an electron injection layer 226 on the electron transport layer 225, and forming the first electrode 227 on the electron injection layer 226. In the present embodiment, the second electrode 221 is an anode, which is an opaque electrode, and the first electrode 227 is a cathode, which is a transparent or translucent electrode. The first electrode 227 of the display panel 2 has a positioning mark on it for laser alignment.

Figure 2:
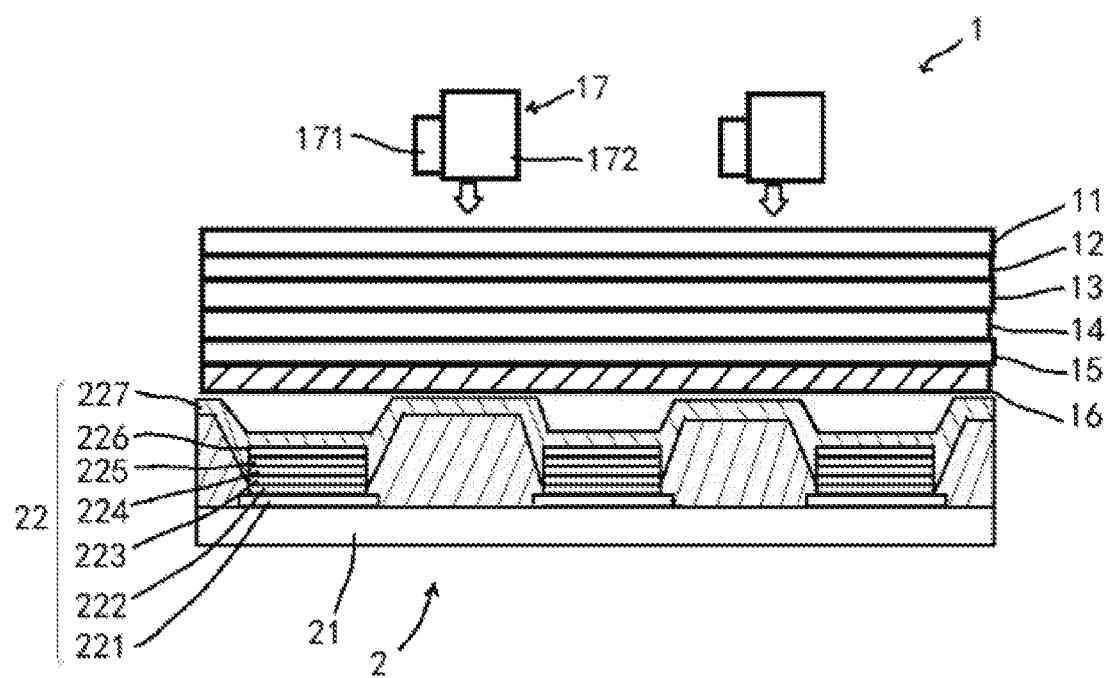
FIG. 2 is a diagram representing a relative position of an auxiliary electrode transfer structure and a display panel during an auxiliary electrode transfer according to an embodiment of the present invention.

As shown in FIG. 2, flipping the auxiliary electrode transfer structure 1 on the first electrode 227, wherein the auxiliary electrode 16 is laminated on the first electrode 227.

Step three is emitting laser by the laser mechanism 17, and the laser is aimed for a position of the first electrode 227 and penetrates the transparent base layer 11 to the light-to-heat transformation layer 13. The light-to-heat transformation layer 13 transforms luminous energy of laser into heat to melt the auxiliary electrode 16 at the position of the first electrode 227, and a new auxiliary electrode 16 is formed again after a surface of the first electrode 227 cures. In the present embodiment, laser irradiates only a position corresponding to cathode patterns, when laser irradiates the light-to-heat transformation layer 13, the light-to-heat transformation material transforms energy of laser into heat, and the light-to-heat transformation layer 13 swells after the light-to-heat transformation material is heated and vaporizes, and hence partial stress is produced where laser irradiates. Because there is only weaker van der Waals force in the graphene layer 14, when the graphene layer 14 deforms and produces stress, parts in the graphene layer 14 and parts between the graphene layer 14 and the middle layer 15 separate with each other, and parts of the middle layer 15 and the auxiliary electrode 16 transfer to the first electrode 227. During the course, because a part of heat of the light-to-heat transformation layer 13 conducts to the auxiliary electrode 16 and melts a part of the auxiliary electrode 16, the auxiliary electrode 16 forms electrical connection to the first electrode 227 after the auxiliary electrode 16 transfers to a surface of the first electrode 227.

Figure 3:
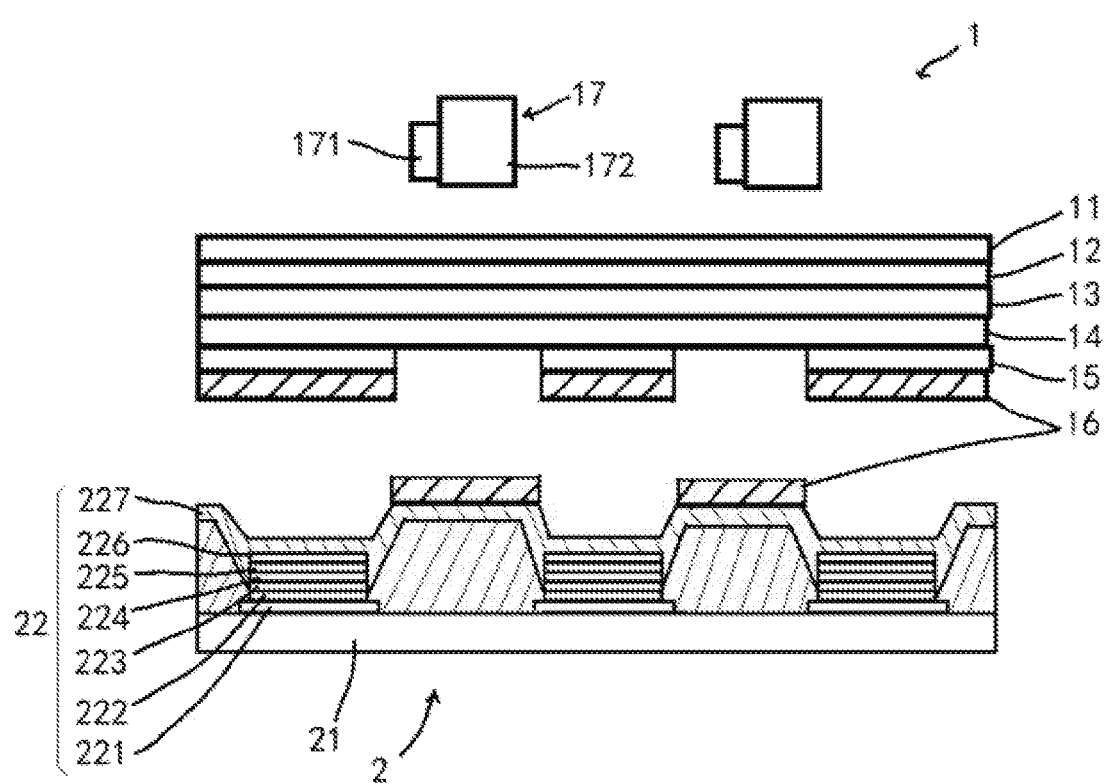
FIG. 3 is a diagram representing a relative position of an auxiliary electrode transfer structure and a display panel after an auxiliary electrode transfer according to an embodiment of the present invention.

As shown in FIG. 3, after laser is removed, the melted auxiliary electrode 16 cools and cures on a surface of the first electrode 227 to form a new auxiliary electrode 16, and transfer of the auxiliary electrode 16 is accomplished.

After that, a subsequent encapsulation process can be performed, as well as an appropriate heat treatment process, to form a better ohmic contact between the auxiliary electrode 16 and cathodes of the OLED devices 22.

The present invention has been described with a preferred embodiment thereof. The preferred embodiment is not intended to limit the present invention, and it is understood that many changes and modifications to the described embodiment can be carried out without departing from the scope and the spirit of the invention that is intended to be limited only by the appended claims.

What is claimed is:

1. An auxiliary electrode transfer structure, comprising:
a transparent base layer;
a light-to-heat transformation layer disposed above the transparent base layer;
an auxiliary electrode disposed above the light-to-heat transformation layer;
a graphene layer disposed between the auxiliary electrode and the light-to-heat transformation layer, wherein a number of layers of the graphene layer ranges from 1 to 10;
a middle layer disposed between the graphene layer and the auxiliary electrode; and
a laser mechanism configured to emit a laser, wherein the laser penetrates the transparent base layer to the light-to-heat transformation layer;
wherein the auxiliary electrode is configured to be placed on a first electrode of an organic light-emitting diode (OLED) device;
wherein the laser mechanism is further configured to emit a laser toward the auxiliary electrode to melt the auxiliary electrode such that melted auxiliary electrode is transferred to a surface of the first electrode.

2. The auxiliary electrode transfer structure as claimed in claim 1, wherein the light-to-heat transformation layer uses materials comprising thermosetting resin, thermoplastic resin, and a laser-absorbing material, and in the light-to-heat transformation layer, a percentage by weight of the laser-absorbing material is between 20 wt % and 40 wt %.

3. The auxiliary electrode transfer structure as claimed in claim 1, further comprising a barrier layer disposed between the transparent base layer and the light-to-heat transformation layer, wherein the barrier layer uses at least one of silica, silicon nitride, or silicon oxynitride materials.

4. The auxiliary electrode transfer structure as claimed in claim 1, wherein the middle layer includes ultraviolet curable resin materials, and a thickness of the middle layer is between 1 um and 5 um.

5. The auxiliary electrode transfer structure as claimed in claim 1, wherein the auxiliary electrode is made of aluminum and has a thickness between 0.1 um and 1 um.

* * * * *